United States Patent [19]

Ficker et al.

[11] 4,186,918
[45] Feb. 5, 1980

[54] METHOD AND APPARATUS FOR LOCATING AND ALIGNING FLIMSY SHEETS

[75] Inventors: Walter W. Ficker, Fishkill, N.Y.; David E. Lonser, Light House Point, Fla.; William G. Rance, Del Ray Beach, Fla.; Alfred A. Stricker; Walter von Kaenel, both of Pompano Beach, all of Fla.

[73] Assignee: International Business Machines Corporation, Armonk, N.Y.

[21] Appl. No.: 859,777

[22] Filed: Dec. 12, 1977

[51] Int. Cl.² ................................ B65H 5/22; B65H 9/08
[52] U.S. Cl. ..................................... 271/232; 271/5; 271/195; 271/98
[58] Field of Search ............... 271/232, 98, 103, 107, 271/108, 90, 93, 236, 238, 5, 11, 14, 97, 195, 210; 198/486; 214/1 BT, 1 BB; 414/752, 749, 750, 195, 294/64 A, 64 B, 64 R, 65

[56] References Cited

U.S. PATENT DOCUMENTS

| 3,220,723 | 11/1965 | Rabinow | 294/64 B |
| 3,837,637 | 9/1974 | Endter et al. | 271/238 |

OTHER PUBLICATIONS

IBM, Technical Disclosure, vol. 18, No. 5, Oct. 1975, Stabilizing Jets for Air-Cushion Levitated Wafers.
IBM, Tech. Disclosure, vol. 17, No. 1, Jun. 1974, Wafer Chuck.
IBM, Tech. Disclosure, vol. 5, No. 4, Sep. 1962, Creating Transverse Curve with Air Jets.

*Primary Examiner*—Robert B. Reeves
*Assistant Examiner*—Brian M. Bond
*Attorney, Agent, or Firm*—James M. Thomson

[57] ABSTRACT

A method and apparatus permitting accurate and repeatable steps of location and alignment of flimsy sheets during their transfer. A preferred embodiment comprises a sheet handler and method for aligning unfired ceramic green sheets used in multi-layer ceramic semiconductor packages. The thin flexible sheets are square or rectangular in shape and are provided with holes accurately punched in each corner thereof for alignment purposes. The sheets are moved by a vacuum input transfer head into orientation with a porous registration surface of an alignment fixture. The sheet is then trapped between opposed pressure zones emanating from the input transfer head and through the porous registration surface, respectively. With the sheet stabilized between the pressure zones four bullet-nosed alignment pins are raised from the registration surface into contact with the holes in the corners of the green sheet, thereby accurately aligning the sheet with respect to the alignment fixture. The input transfer head is then withdrawn and an output transfer head picks up the aligned sheet via vacuum means and transfers it to other processing locations. In an alternate embodiment the pressure zones are created between the output transfer head and the registration surface of the alignment fixture.

9 Claims, 5 Drawing Figures

METHOD AND APPARATUS FOR LOCATING AND ALIGNING FLIMSY SHEETS

BACKGROUND OF THE INVENTION

Related Applications

U.S. Patent Application Ser. No. 740,707 filed Nov. 11, 1976 entitled "Apparatus for the Printing of Ceramic Green Sheets" by R. H. Cadwallader, Y. Darves-Bornoz, A. S. Gasparri and F. Racine and assigned to International Business Machines Corporation.

U.S. Patent Application Ser. No. 859,778 filed concurrently with the present application entitled "Pick Up and Placement Head for Green Sheet and Spacer" by A. H. Buchmann, T. J. Cochran, W. W. Ficker, A. A. Stricker and W. VonKaenel and assigned to the International Business Machines Corporation.

Field of the Invention

The present invention relates to a method and apparatus permitting accurate and repeatable alignment of flimsy sheets during transfer thereof. More particularly, the invention relates to a sheet handler and method for aligning unfired ceramic green sheets used in the fabrication of multi-layer ceramic semiconductor packages.

Description of the Prior Art

Multi-layer ceramic semiconductor packages are becoming more widely used in integrated circuit devices. Such semiconductor packages generally comprise stacks of ceramic sheets upon which conductive patterns have been printed.

The ceramic sheets used in such semiconductor packages are initially formed by preparing a mixture of finely divided ceramic material, a suitable solvent, and a vehicle. The mixture of ceramic material is formed into a thin layer and dried to drive off the solvent leaving a thin flexible paper like sheet commonly referred to as ceramic green sheet. The sheet is cut into small pieces of appropriate size and shape and processed by punching via holes therein, filling the via holes with conductive paste and printing a conductive circuit pattern on the surfaces thereof where appropriate.

A plurality of the process sheets are then assembled, pressed, trimmed and sintered in an oven at high temperature to form a rigid unitary ceramic body having interconnected conductive patterns throughout its interior. In finishing the package suitable top and bottom metallurgys are applied making contact with the metallurgy patterns through via holes previously punched in the exposed green sheet. Terminals and semiconductor devices are then attached and the unit is encapsulated.

This type of semiconductor package is highly desirable since various circuitry can be embodied within the substrate. Moreover, it makes possible more complex circuit arrangements than were heretofore possible by merely depositing a plurality of metallic layers upon the substrate.

The handling of the individual green sheets in the above described process presents many problems, however. In particular, the uncured ceramic green sheets are relatively fragile and can be easily damaged by handling since they have a thickness in the order of 0.008" and lateral dimensions which are large in comparison to the thickness. Moreover, as more and more circuit patterns are incorporated in such packages, the trend is to enlarge the dimensions of the sheets which are being stacked in a given package. This increases the likelihood of handling damage. Furthermore, the orientation of the green sheets relative to masks used to form personalized conductive patterns requires careful and accurate alignment. This is normally accomplished by use of alignment holes pumched in the corner or edge portions of the sheet where interference with the desired printed circuit patterns does not occur.

As green sheet was moved into an alignment zone it was previously known to deposit the green sheet over alignment pins. This was done manually in an attempt to avoid damage or enlargement of the alignment holes since the green sheet is very susceptible to tearing or stretching. Such a system is described in the aforementioned related application by Cadwallader et al., for example.

The use of such manual techniques to handle and align flimsy green sheet have not been entirely satisfactory. In particular, manual handling often results in tearing of the filmsy sheets. In addition, the touching of the green sheet material in areas where conductive patterns are to be printed is difficult to avoid, and this results in damaged green sheet which results in a lowering of yields after the printing operation. Therefore, a need exists in the prior art for means to accurately align and transfer filmsy sheets, such as unfired ceramic sheets, by automated means.

SUMMARY OF THE INVENTION

Accordingly, it is an object of the invention to provide an improved means for handling and transporting flimsy sheets, such as ceramic green sheets, so that the location of the sheet can be accurately established in relation to a reference surface.

It is a further object of the invention to provide a method of alignment and transport of such sheets in an automated system.

These objects and other features and advantages are attained in a system wherein ceramic green sheets are handled and transported by means of vacuum applied through a transfer head. The location of the green sheet with respect to a reference surface is established by use of locator holes placed in the corners of the green sheet, which are adapted to correlate with alignment pins in the reference surface as the transfer head is moved into cooperative relationship therewith. In the operation of the system the transfer head picks up ceramic green sheet from a tray or stack and transports it to the alignment surface. The vacuum pressure on the sheet is then replaced by a slight positive pressure which is counterbalanced by a corresponding positive pressure from the registration surface. With the ceramic green sheet suspended between counterbalancing pressure zones, bullet nosed alignment pins are raised from the registration surface and gently pushed into the locator holes in the green sheet. After the alignment pins are engaged with the green sheet, pressure is reduced from the alignment surface whereby the green sheet is gently settled against the registration surface.

After that step, the input transfer head is moved away from the registration surface and an output transfer head is lowered over the registration surface. Vacuum pressure is then applied through the output transfer head, and the green sheet is adhered thereto in aligned relationship for movement to another stacking zone for further processing.

BRIEF DESCRIPTION OF THE DRAWINGS

Other features and advantages of the invention will be apparent from the following detailed description taken in conjunction with the drawings wherein.

DETAILED DESCRIPTION OF THE INVENTION

Figure 1:
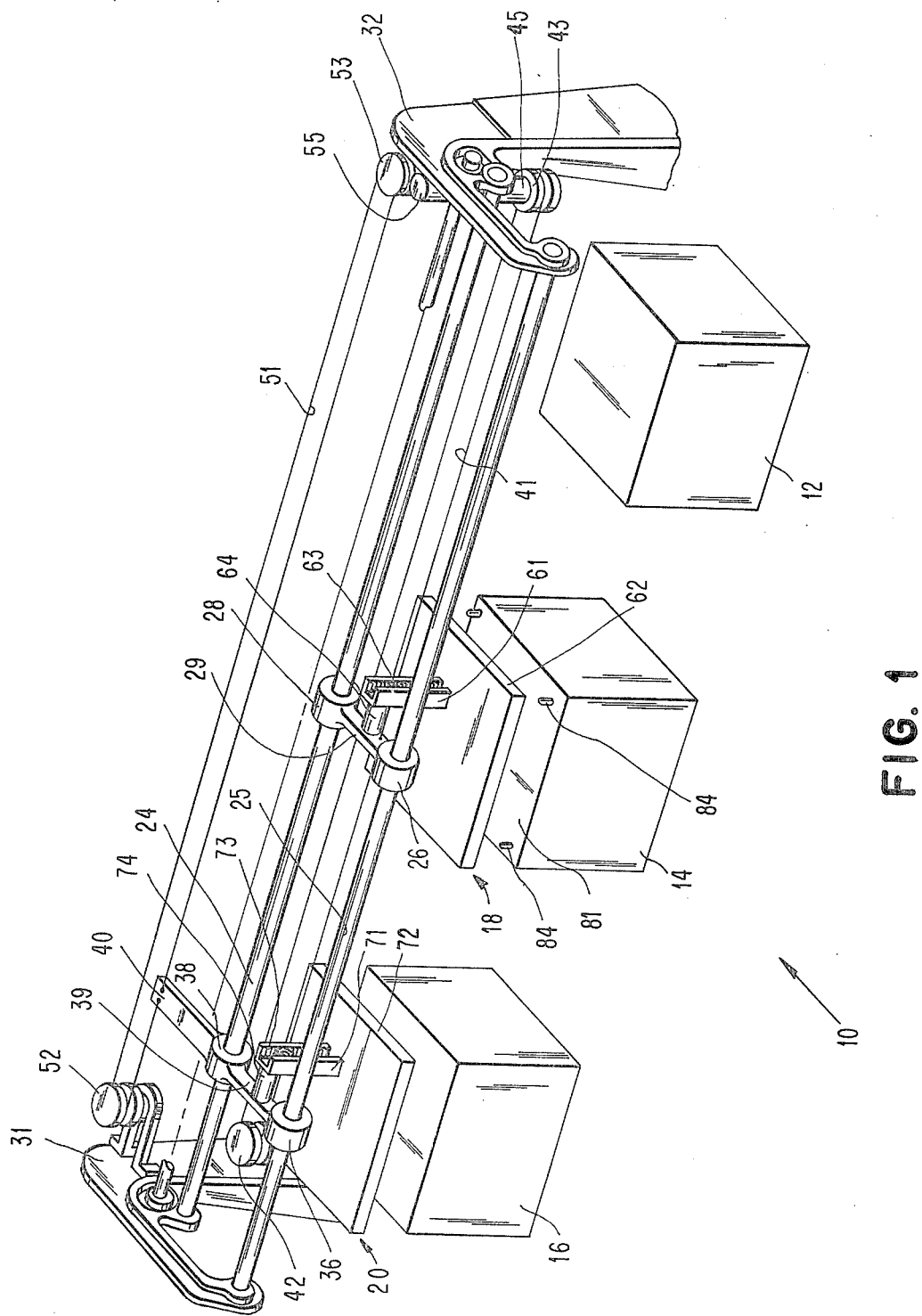
FIG. 1 represents a system adapted for transfer and alignment of flimsy sheets.

Referring now to the drawings and particularly to FIG. 1, a handling and transport system 10 is illustrated including an input station generally indicated by numeral 12, an alignment station indicated by numeral 14 and an output station indicated by numeral 16. An input transfer head 18 is illustrated which is selectively movable between the input station and the alignment station; and an output transfer head 20 is illustrated which is selectively movable between the alignment station and the output station 16. The head transfer means includes rods 24, 25 suspended over stations 12, 14, 16 from brackets 31, 32.

Input transfer head 18 is mounted for transfer or movement along rods 24, 25 by bushings 26, 28 which are secured to a cross member 29 that serves to support the input transfer head. In similar fashion bushings 36, 38 are mounted for movement on rods 24, 25 and attached to cross member 39 which supports output transfer head 20.

Means are provided for selectively moving input head 18 along rods 24, 25 including a cable 41 that is attached to cross member 29; the cable also being journaled on pulleys 42, 43 respectively. An electric motor 45 is provided for selectively driving pulley 43 and cable 41 to move input transfer head 18 in either direction between stations 12, 14, respectively.

In similar fashion a cable 51 is provided, journaled on pulleys 52, 53 and driven by motor 55. Cable 51 is attached to an extension 40 of cross member 39 whereby output transfer head 20 can be selectively moved from the alignment station to output station 16. It should be apparent that other means could be provided, such as pneumatic means, for moving the transfer heads.

Other means are provided to move transfer head 18 vertically with respect to stations 12, 14. In the embodiment illustrated such means include a rack 61 attached to a base member 62 of the transfer head, and a corresponding pinion 63 journaled on cross member 29 and selectively driven by an electric motor 64. A similar configuration is provided for moving output transfer head 20 vertically with respect to stations 14, 16 including rack 71 attached to base member 72, and a pinion 73 selectively driven by motor 74.

In FIG. 1 station 12 is illustrated as having a flat upper surface adapted to receive stacks of flimsy sheets to be aligned. If desired, station 12 could be provided with a tray arrangement or other means for retaining flimsy sheets, though such is not required. Station 16 could likewise include a tray or other arrangement to retain the accurately aligned sheets in preparation for their movement to other locations for stacking and/or further handling.

Station 14 is illustrated as comprising a flat reference surface 81 having a plurality of movable pins 84 projecting from the corners thereof adapted to fit through the corresponding locator holes provided in the corners of the rectangular sheets to be handled. The pins are selectively movable in a vertical relationship with respect to the reference surface by a mechanism illustrated particularly in FIG. 5.

Figure 5:
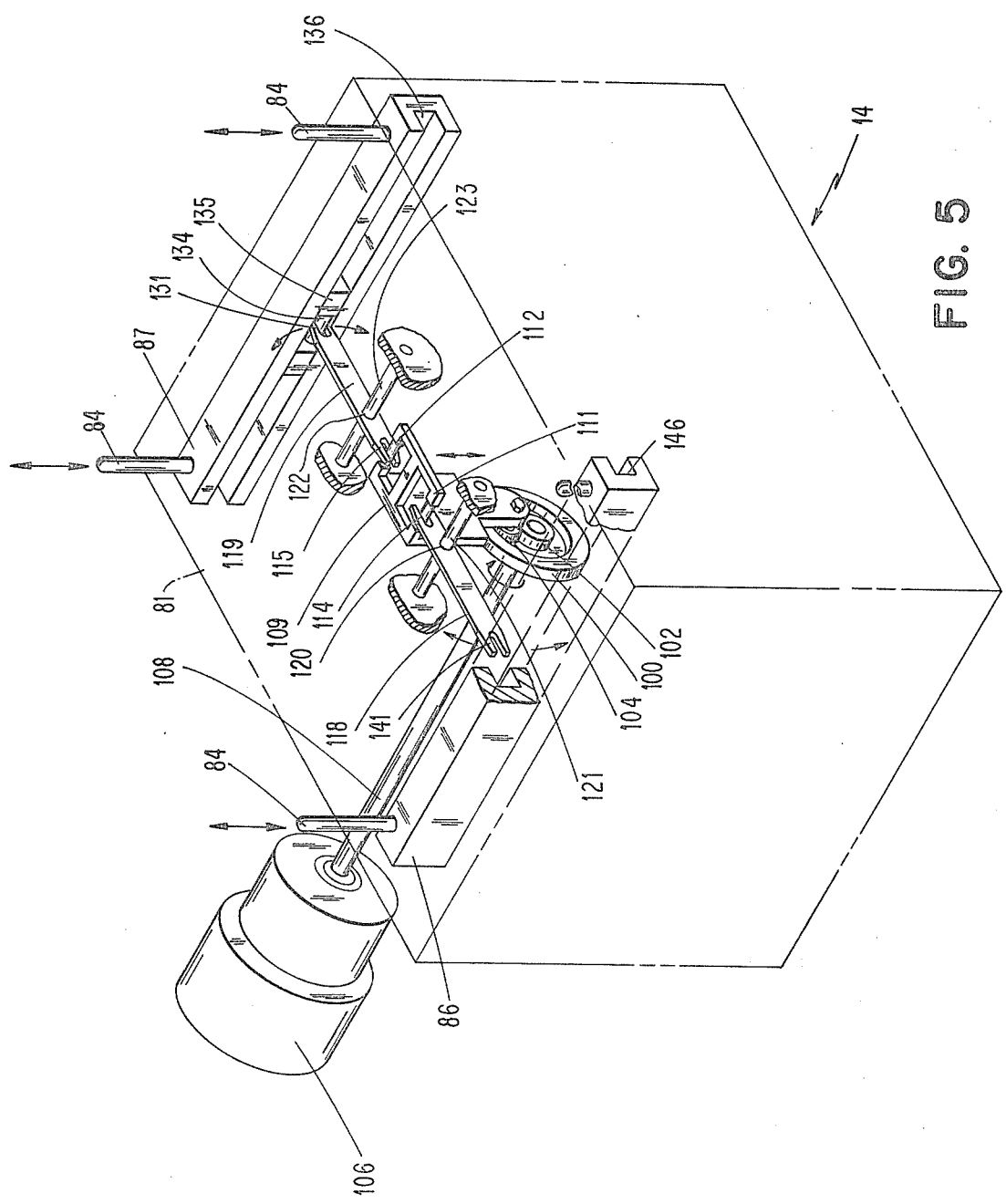
FIG. 5 is a schematic representation of a portion of the mechanism illustrated in FIG. 1 for selectively moving alignment pins into engagement with the green sheet.

As shown in FIG. 5 pins 84 are attached to bars 86, 87 respectively. The bars are spaced beneath the reference surface 81 and the pins, when raised, project through holes provided in the reference surface so as to move into engagement with green sheets. When lowered, the pins are withdrawn below reference surface 81.

The mechanism for raising and lowering the pins includes cam member 100 having a cam surface 102 formed therein and a cam follower 104 associated therewith. The cam member is adapted to be driven by a motor 106 via a shaft 108. Cam follower 104 is attached and moves driven member 109 in response to rotation of the motor. Member 109 is generally L-shaped, as illustrated, and includes horizontally oriented bars 111, 112 that are adapted to engage and fit within jaw portions 114, 115 of pivot bars 118, 119 respectively. Pivot bar 118 is rotatably fixed at a reference point 120 by a shaft 121 extending therethrough. In similar fashion bar 119 is rotatably fixed a reference point 122 by a shaft 123 extending therethrough.

The outer end of bar 119 includes jaws 131 which are adapted to receive and engage a shaft 134 which comprises the center of a dumbbell configuration 135 retained within a slot 136 of member 87. In similar fashion, the outer end of bar 118 includes jaws 141 adapted to engage a shaft, not illustrated, of a similar dumbbell arrangement retained within slot 146 of member 86.

During operation of the mechanism illustrated in FIG. 5, the rotation of shaft 108 in response to energization of motor 106 results in rotation of the cam and cam surface. This causes cam follower 104 to move up or down. This action, in turn, causes member 109 to follow a similar path and thereby move the inner ends of pivot bars 118, 119. Upward movement of the inner ends of the pivot bars results in downward movement of members 86, 87, thereby lowering the pins. In contrast, the pins are raised by downward movement of the inner ends of the pivot bars.

Figure 2:
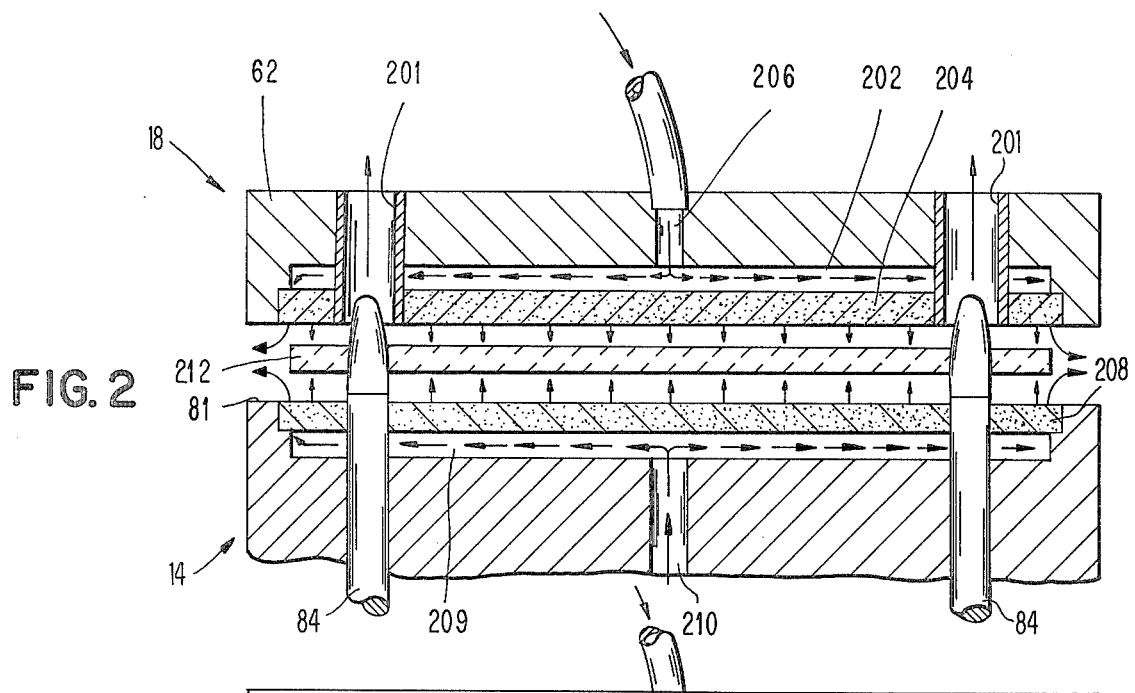
FIGS. 2-4 are schematic representations of an input transfer head and an alignment fixture illustrating various stages in the handling and alignment of ceramic green sheet.
Figure 3:
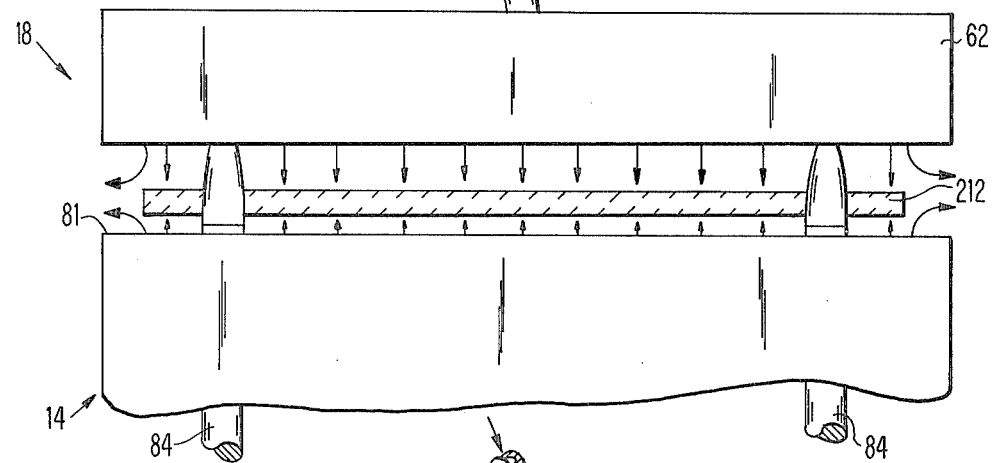
Figure 4:
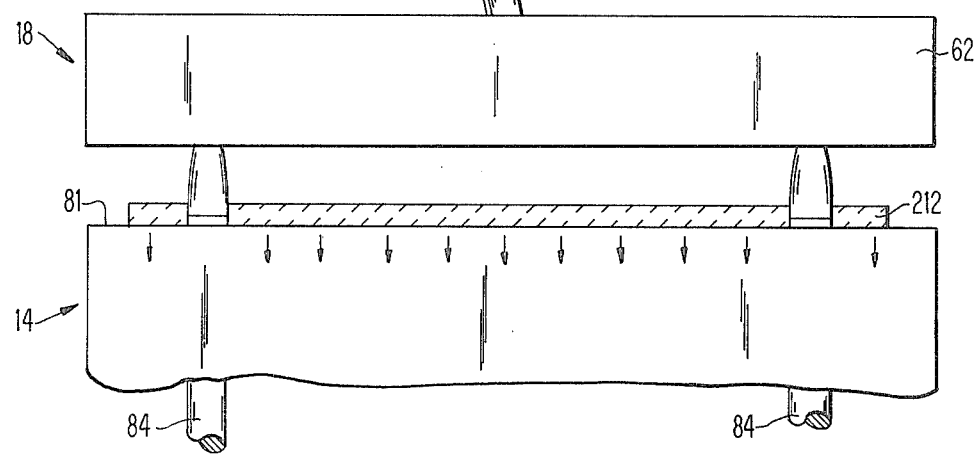

Referring now to FIGS. 2-4 the manner in which input transfer head 18 cooperates with alignment station 14 is specifically illustrated. Input transfer head 18 is illustrated as including plate member 62 having openings 201 formed in the corners thereof, adapted to permit pins 84 to pass through the plate member as it is lowered into cooperative association with the alignment station. Member 62 otherwise includes a recessed vacuum chamber 202 formed therein closed on the facing side by a porous or perforated plate 204. Chamber 202 communicates with an air supply, not illustrated, via tube 206 whereby either vacuum or positive pressure may be applied to the inner chamber. Air slots can be provided along the periphery of the member, if desired. It should also be recognized that a specific transfer head design such as that described in the aforementioned related application could be utilized, if desired.

Reference surface 81 of the alignment station is defined by a porous plate member 208 which defines an internal vacuum chamber 209 adapted to receive vacuum or positive pressure via tube 210. Pins 84 are adapted to project above surface 81 or can be retracted through openings 212 formed therein, if desired.

The first step in alignment of a flimsy sheet is orientation of the transfer head over input station 12 with member 62 lowered into operative association with a tray or other member retaining flimsy sheets in a stack. The input transfer head is lowered a sufficient degree whereby application of vacuum pressure to chamber 202 results in the pick up of a flimsy sheet onto the face of the input transfer head. The transfer head is then raised and moved along rods 24, 25 to alignment station 14.

When oriented over alignment station 14 the transfer head is lowered into operative association with reference surface 81 of the alignment station. As the input transfer head approaches the alignment station surface 81, positive pressure is applied to chamber 209 of the alignment station and upward air pressure is created on the bottom of the sheet, such as sheet 212 illustrated in FIG. 2, for example. At the same time vacuum supply to chamber 202 is switched off and positive pressure is applied thereto so that a corresponding downward pressure is also exerted upon the sheet. These pressures are adjusted to balance each other whereby sheet 212 is suspended in a stable condition between two opposed pressure zones.

With the sheet 20 suspended pins 84 are selectively raised through the surface of the alignment station to gently engage and pass through the openings in the corners of the sheet. Due to the bullet-nose configuration of the pins and the relative flexibility of the sheet suspended between the opposed pressure zones the movement of the pins through the corners is facilitated without tearing or distorting the openings in the sheet. Consequently, the sheet can be accurately aligned with respect to the pins and reference surface without stretching, tearing or otherwise distorting the sheet. Moveover, the pressure zone supports the center of the sheet against the force of gravity without causing sag and resulting distortion.

With the sheet in alignment with the pins the pressure from reference surface 81 is reduced and the sheet is slowly moved into contact with the reference surface. This can be accomplished with a simultaneous movement of the transfer head into a lower position, or merely by changing the differential pressure on the sheet. With the sheet in contact with reference surface 81 the input transfer head is withdrawn upwardly and translated back toward the input station to pick up another sheet.

At the same time, the output transfer head is moved into orientation with the alignment station and lowered into operative relationship with surface 81 thereof. Vacuum pressure is then applied to pick up the fully aligned sheet from station 14, and the output transfer head moves the sheet to station 16 where it is deposited in a stack of interleaved elements or in a tray or on pins for subsequent processing.

It should be apparent that the system described herein enables the accurate alignment and orientation of flimsy green sheets without manual handling thereof with a minimum of distortion and damage thereto. The system permits unaligned green sheets to be picked up and handled in an orderly condition fashion to place such sheets in an accurate aligned state for further processing. The use of balanced opposed pressure zones to suspend the green sheet during insertion of bullet-nosed pins is particularly advantageous in that it enables handling of the sheets without distortion of the openings in the corners and with minimal sag.

What is claimed is:

1. A method of aligning flimsy sheets of material comprising the steps of:

delivering a sheet of flimsy material by means of a transfer head to an alignment station, Placing the transfer head within a small distance of a reference surface on the alignment station and suspending the sheet between opposed pressure zones created by povitive air pressure derived from the transfer head and the reference surface, respectively, moving alignment pins through locator holes provided in the corners of the sheet and reducing the air from the reference surface.

2. The method of claim 1 further including the steps of lowering the sheet to said alignment surface, moving the transfer head away from the alignment station, and picking up the sheet with an output transfer head for movement to another processing location.

3. The method of claim 1 wherein said transfer head utilizes vacuum pressure to pick up and retain a sheet.

4. The method of claim 2 wherein the sheet is lowered by gradually decreasing positive pressure from the alignment station.

5. A system for transporting the aligning flimsy sheets including:

an alignment station with input transfer means to pick up and transfer sheet to said alignment station and output transfer means to pick up and transport said sheets away from said station in an aligned state, said alignment station including alignment means for locator surfaces in said sheets, and said system including pressure control means for suspending the sheets between opposed positive pressure zones derived from the input transfer means and the alignment station to permit general engagement of the alignment means with the locator surfaces in the sheet.

6. The system of claim 5 wherein said input transfer means and said output transfer means include means for applying vacuum pressure to pick up and retain sheets.

7. The system of claim 6 wherein the alignment station includes means for selectively lowering said aligned sheet into contact with the alignment station by reducing the positive pressure beneath the sheet after the alignment means are engaged with said locator surfaces.

8. The system of claim 6 wherein the alignment means comprise a plurality of pins adapted to be selectively raised into engagement with corresponding locator holes formed in the corners of rectangular flimy sheets.

9. The system of claim 8 wherein said locator pins are of elongate bullet-nosed shape and circular cross-section.

* * * * *